(12) United States Patent
Goyette

(10) Patent No.: US 6,433,642 B1
(45) Date of Patent: Aug. 13, 2002

(54) IMPEDANCE MATCHED FREQUENCY DEPENDENT GAIN COMPENSATION NETWORK FOR MULTI-OCTAVE PASSBAND EQUALIZATION

(75) Inventor: William R. Goyette, San Marcos, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/619,462

(22) Filed: Jul. 19, 2000

(51) Int. Cl.[7] ................................................. H03F 3/04
(52) U.S. Cl. ........................ 330/304; 330/302; 330/306
(58) Field of Search ................................. 330/302, 304, 330/306, 310; 333/28 R, 28 T

(56) References Cited

U.S. PATENT DOCUMENTS

| | | | | |
|---|---|---|---|---|
| 3,938,056 A | * | 2/1976 | Pond | 330/43 |
| 4,266,204 A | * | 5/1981 | Jacoby | 333/28 R |
| 4,489,281 A | * | 12/1984 | Riyono | 330/129 |
| 5,280,346 A | * | 1/1994 | Ross | 358/38 |
| 6,160,452 A | * | 12/2000 | Daughtry et al. | 330/277 |
| 6,188,279 B1 | * | 2/2001 | Yuen et al. | 330/149 |

FOREIGN PATENT DOCUMENTS

JP  64-54915  * 3/1989  ................. 330/304

* cited by examiner

Primary Examiner—Robert Pascal
Assistant Examiner—Henry Choe
(74) Attorney, Agent, or Firm—Harness, Dickey & Pierce, P.L.C.

(57) ABSTRACT

An impedance matched frequency dependent gain compensation network for multi-octave passband equalization. A first stage amplifier outputs an amplified signal to an equalizer, which in turn outputs an equalized signal to a second stage amplifier. The equalizer varies the attenuation in accordance with the frequency to provide minimum gain variation, thereby providing optimal noise characteristics and generally constant linearity.

16 Claims, 4 Drawing Sheets

IMPEDANCE MATCHED FREQUENCY DEPENDENT GAIN COMPENSATION NETWORK FOR MULTI-OCTAVE PASSBAND EQUALIZATION

BACKGROUND

1. Technical Field

The present invention relates generally to gain compensation in an amplifier circuit and, more particularly, to an equalizer having a frequency dependent gain for multi-octave passband equalization.

2. Discussion

May communications systems operate over a wide range of radio frequency (RF) input frequencies. Where the maximum frequency is at least double the minimum frequency, the communication system is considered multi-active and presents special considerations. For example, a L-band digital receiver can receive frequencies over the range of 600 megahertz (MHz) to 1,800 MHz. Such a typical digital receiver includes an amplifier for sufficiently amplifying an input signal for processing. Similarly, many RF transmitters include an amplifier for sufficiently amplifying the signal prior to output by the transmitter.

In order to achieve the optimal noise and linearity required by receivers and transmitters, two wideband commercial amplifiers are typically cascaded in a chain. The first amplifier in the chain preferably has a low noise characteristic and moderate linearity. The second amplifier in the chain preferably provides a better noise characteristic and improved linearity. An impedance matching network is inserted between each amplifier stage to improve the input and output voltage standing wave ratio (VSWR).

Such amplifier chains typically include a pair of amplifiers, each providing a specific, predetermined amplification. For example, the L-band digital receiver typically includes a front end amplifier chain which provides high linearity, low noise, and a nominal gain of 21 decibels (db) across a band of approximately 500 MHz to 1,900 MHz. To achieve optimal noise and linearity, two wideband commercial amplifiers are selected. The first stage has a low noise and moderate linearity. The second stage has good noise performance and high linearity. The amplifier chain is typically implemented using a low cost, compact, high performance, wide band monolithic microwave integrated circuit (MMIC).

Each MMIC amplifier in the amplifier chain of the L-band digital receiver has a modest gain slope across the input or passband range of 600 MHz to 1,800 MHz. Each amplifier typically provides a falloff or gain of approximately 1.5 to 2.0 db over approximately 500 MHz to 2 gigahertz (GHz). The falloff in gain results in a negative gain slope over an increasing frequency. Such a gain slope is characteristic of multi-octave wideband package MMIC amplifiers or gain blocks. Because each amplifier or gain block is arranged for operation with a matched, 50 ohm system, passband equalization using lossless reactive elements was not possible.

The above-described amplifier chain may be modeled with a standard 4 db attenuator pad placed between each amplifier stage. Such modeling results in a well matched network with gains nominally sloping from 24 db to 21 db over the frequency range of interest. The gain of the amplifier network is preferably set to establish a minimum noise value at the high end of the frequency range where the gain is the lowest. That is, the high end of the frequency range preferably has a noise figure or additive noise of approximately 3.2 db. However, the linearity of the network at the high end of the frequency passband is nominally 13 db relative to an input power of approximately 1 milliwatt. At the low end of the frequency range where the gain is highest, the linearity is significantly degraded to a nominal level of approximately 10.8 decibels relative to an input power of one milliwatt because the second stage amplifiers are overdriven by first stage amplifier.

In the above-described networks, there is a tradeoff between the gain, the noise, and the resistance to distortion of the amplifier network. In a typical MMIC amplifier used in a network for transmitters and receivers operates on frequencies where the high frequency is at least double the lowest frequency, the gain of the amplifier decreases as the frequency decreases. When the gain decreases, the noise of the amplifier increases. Further, in multi-stage amplification networks, even though the gain of the first stage must be set at some minimum, the gain must be limited in order to maintain linearity of the second stage amplifier. At the lower end of the frequency range, the relatively high gain and low frequency significantly impact the linearity of the second stage amplifier. Further, specifications for each amplification stage of the network typically require a generally even balance of gain across the entire frequency band at each stage.

Thus, it is desirable to provide a passband equalization network which preserves linearity and noise requirements while simultaneously maintaining proper impedance matching. In the example described above, is desirable to flatten the gain passband of the first stage amplifier so as to overdrive the second stage amplifier. The slope of the entire network would have to be fairly flat and linear over the operating frequency range. Further, such a network must be impedance matched with maximum return loss in order to avoid inducing passband ripple caused by reflected RF energy.

SUMMARY OF THE INVENTION

The present invention is directed to an amplifier network including a first amplifier receiving an input signal and generating a first output signal. An equalizer receives the output signal and attenuates the first output signal in accordance with the frequency of the input signal. The equalizer generates an equalized signal. A second amplifier receives the equalized signal and generates an output signal for the network. The equalizer includes a PI network and a TEE network interconnected in a symmetric configuration.

For a more complete understanding of the invention, its objects and advantages, reference should be made to the following specification and to the accompanying drawings.

DESCRIPTION OF THE PREFERRED EMBODIMENT

Figure 1:
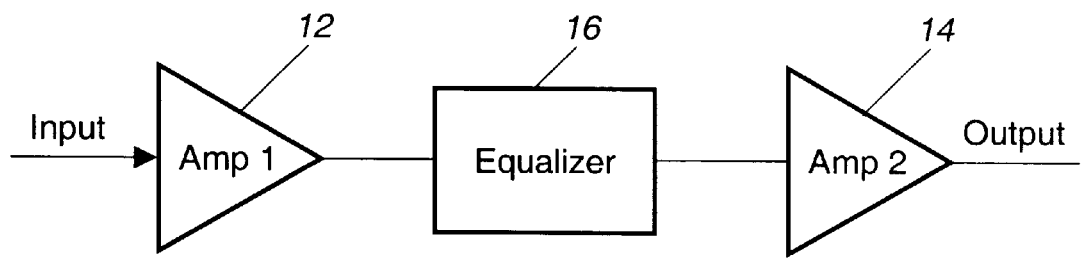
FIG. 1 is a block diagram of the impedance matched, frequency dependent gain compensation network arranged in accordance with the principles of the present invention.

FIG. 1 depicts a block diagram of an amplifier network 10. As described herein, amplifier network 10 is an impedance matched, frequency dependent gain compensation network for multi-octave passband equalization. Amplifier network 10 includes a first stage amplifier 12 and a second stage amplifier 14. First stage amplifier 12 and second stage amplifier 14 are separated by an equalizer 16. Equalizer 16 implements an impedance matched, frequency dependant gain compensation for properly integrating the output from first stage amplifier 12 to second stage amplifier 14.

Figure 2:
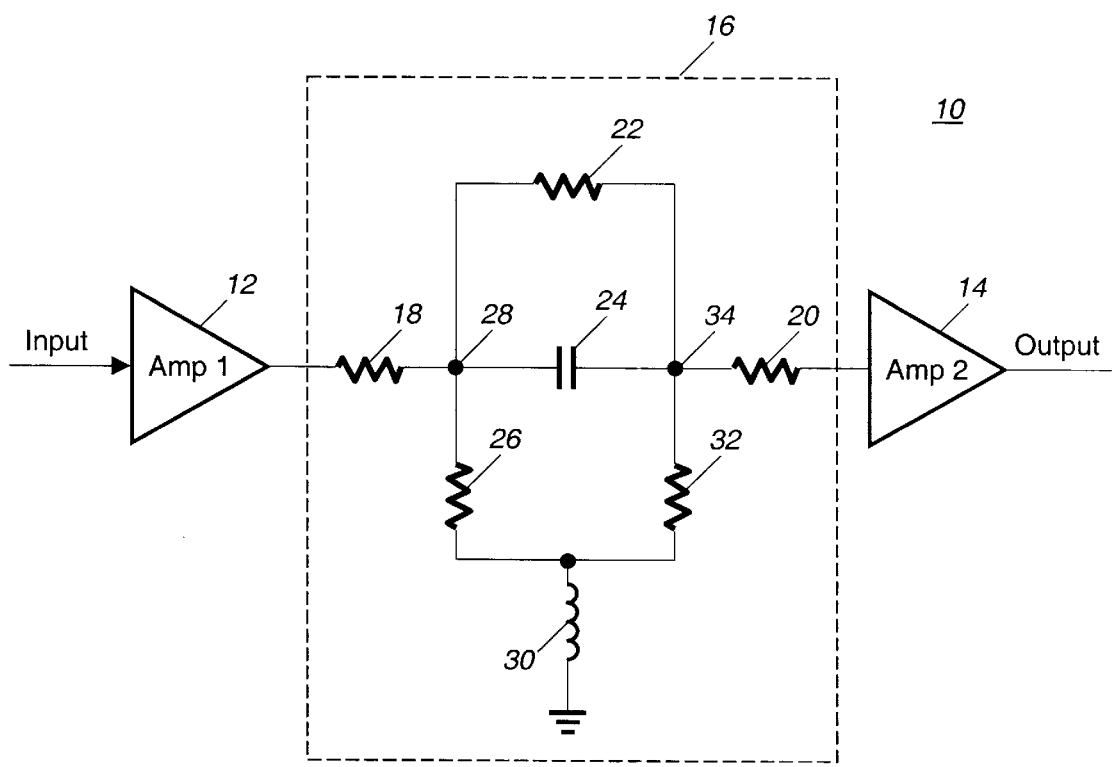
FIG. 2 is a partial block and partial schematic diagram of FIG. 1 showing the equalizer in a schematic representation.

FIG. 2 depicts a partial schematic diagram depicting the components of equalizer 16. With reference to FIG. 2, first stage amplifier 12 and second stage amplifier 14 are as described with respect to FIG. 1. Similarly, equalizer 16 is as described with respect to FIG. 1. The components of equalizer 16 include an input resistor 18 and an output resistor 20. Input resistor 18 is connected to the output of first stage amplifier 12. Output resistor 20 is connected to the input of the second stage amplifier 14. A series resistor 22 is placed in series with input resistor 18 and output resistor 20. A capacitor 24 is placed in parallel with series resistor 22. A first shunt resistor 26 has a first terminal connected to a node 28 which interconnects one terminal of each of respective input resistor 18, series resistor 22, and capacitor 24. The other terminal of first shunt resistor 26 is connected to an inductor 30, the other terminal of which is connected to ground. A second shunt resistor 32 has a first terminal connected to a node 34 which interconnects one terminal of each of respective output resistor 20, series resistor 22, and capacitor 24. The other terminal of resistor 32 connects to one terminal of each of respective first shunt resistor 26 and inductor 30.

As can be seen from FIG. 2, equalizer 16 includes PI and TEE networks arranged in a symmetric configuration. First shunt resistor 26, series resistor 22, and second shunt resistor 32, cooperate to form the PI network. The TEE network is formed symmetrically by first shunt resistor 26, input resistor 18, series resistor 22, and output resistor 20. Second shunt resistor 32 cooperates with output resistor 20, series resistor 22, and input resistor 18 to form a second TEE network. Alternatively, the first TEE network may be considered to consist of shunt resistor 26, input resistor 18 and series resistor 22, and the second TEE network may be considered to consist of shunt resistor 32, output resistor 20 and series resistor 22. Equalizer 16 can be considered to include a series leg which comprises input resistor 18, output resistor 20, series resistor 22, and capacitor 24. Equalizer 16 may also be considered to include a shunt leg which comprises first shunt resistor 26, second shunt resistor 32, and inductor 30.

In operation, reactive elements, namely, capacitor 24 and inductor 30, have impedances which vary in accordance with the frequency of the input signal applied to first stage amplifier 12. By varying the respective impedances of capacitor 24 and inductor 30, attenuation provided by equalizer 16 can be varied in order to provide the desired linearity and noise while maintaining proper impedance matching. More particularly, in response to relatively low frequency, the impedance of capacitor of 24, increases, or tends towards an open circuit impedance, and the impedance of inductor 30 decreases, or tends towards a short circuit impedance.

In response to the changing impedances at low frequency, the resistance through the series leg of equalizer 16 increases, and the impedance through the shunt leg of the equalizer 16 decreases. This increases the attenuation, or decreases the gain, of equalizer 16. Correspondingly, at relatively high frequencies, the impedance of the capacitor 24 decreases, or tends towards a short circuit impedance, and the impedance of inductor 30 increases, or tends towards an open circuit impedance. This causes a decrease in the impedance through the series leg of equalizer 16 and an increase in the impedance through the shunt leg of equalizer 16. This decreases the attenuation, or increases the gain, of equalizer 16. Through the proper selection of the values of capacitor 24, inductor 30, and the respective resistors of equalizer 16, the resulting attenuation in the desired frequency range will vary in a near linear manner, and a desired return loss can be achieved.

In a preferred embodiment, first stage amplifier 12 may be implemented using an MGA-82563 MMIC amplifier by Agilent Technologies, and second stage amplifier 14 may be implemented using an AM1 MMIC amplifier by Watkins-Johnson Company. For such a configuration using first stage amplifier 12 and second stage amplifier as described herein, the following table provides preferred values for each component of equalizer 16.

| Component | Reference Number | Value |
| --- | --- | --- |
| Input resistor | 18 | 13 ohms |
| Output resistor | 20 | 13 ohms |
| Series resistor | 22 | 3.3 ohms |
| Capacitor | 24 | 0.6 pF |
| First shunt resistor | 26 | 75 ohms |
| Inductor | 30 | 3.6 nH |
| Second shunt resistor | 32 | 75 ohms |

Figure 3:
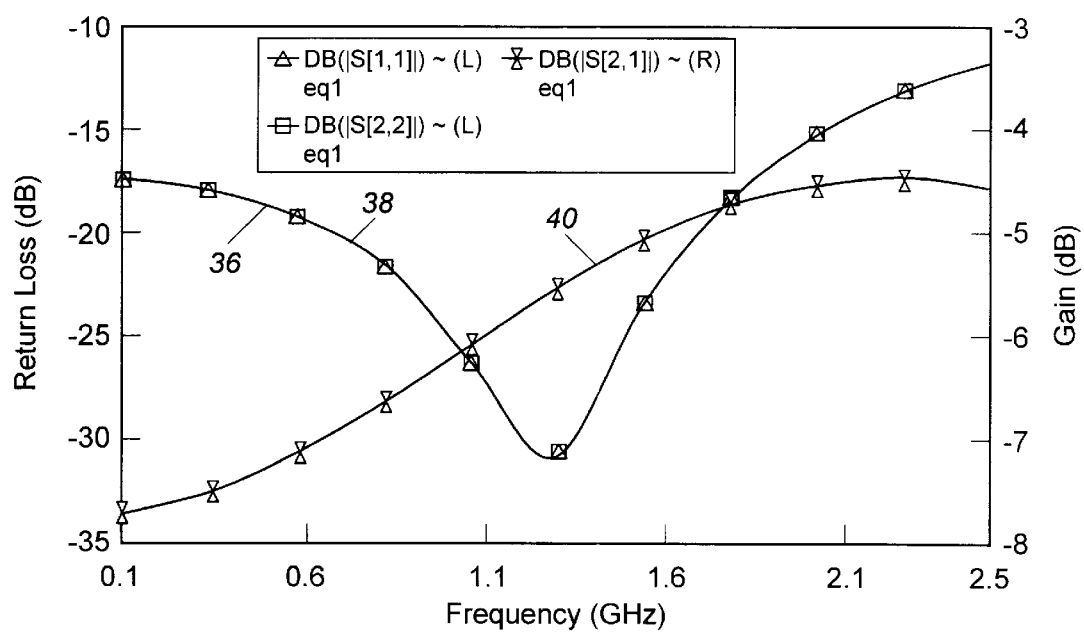
FIG. 3 is a graph showing the response characteristic of the equalizer.

FIG. 3 depicts a plot of the equalizer response as a function of frequency. The left vertical axis of FIG. 3 measures return loss in decibels, and the right vertical axis measures gain an decibels. A first waveform 36, in which triangles delimit data points, measures the input return loss of equalizer 16. A second waveform 38, in which squares delimit data points, measures the output return loss of equalizer 16. A third waveform 40 measures the gain of equalizer 16. As can be seen with respect to FIG. 3, as frequency increases from 0.6 GHz to approximately 1.8 GHz, the gain of equalizer 16 increases linearity over the range of approximately of −7.2 through −4.8 db.

Figure 4:
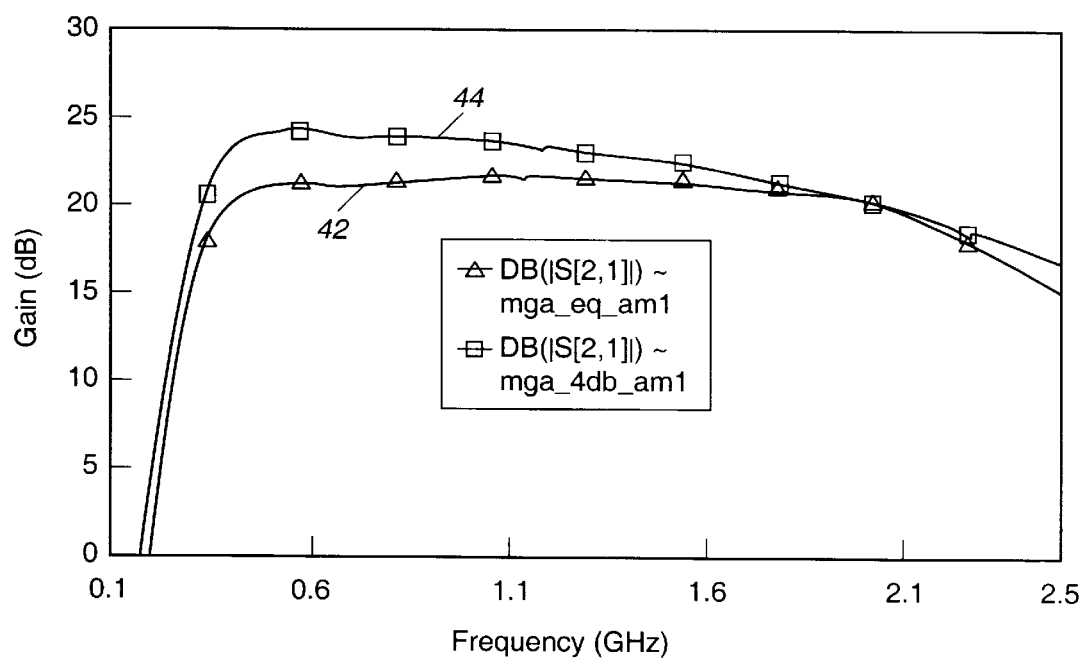
FIG. 4 is a graph showing the response of the amplifier networks for both an equalizer and an attenuator pad.

FIG. 4 depicts the gain of the amplifier network 10 and the gain typically provided by a 4 db attenuator pad. It should be noted that FIG. 4 depicts the gain for the entirety of the network rather than for just equalizer 16, as is shown in FIG. 3. Waveform 42 represents the gain of amplifier network 10 implemented in a preferred embodiment as described herein. Waveform 44 represents the gain provided by an amplifier network having a 4 db attenuator pad substituted for equalizer 16 of the present invention.

As can be seen from FIG. 4, waveform 42, corresponding to amplifier network 10 of the present invention, provides improved linear performance of the system over the desired operating frequency range of approximately 500 MHz to 1,900 MHz. Thus, as can be seen from the present invention, placing equalizer 16 between first stage amplifier 12 and second stage amplifier 14 minimizes the gain variation providing optimal noise characteristics and improved linearity. The cascaded passband slope of first stage amplifier 12, equalizer 16, and second stage amplifier 14, as described in the preferred embodiment, is flat within a 1 db window verses a 3.5 db variation for the frequency range of interest. Further, amplifier network 10 exhibits a noise figure established by first stage amplifier 12. As described herein, the noise figure would be 3.2 db and linearity variation over the passband is reduced from a nominal 3 db (IIP3 range from +13.7 dbm to +10.8 dbm) to less than 1 db (IIP3 range from +13.7 dbm to 12.8 dbm).

While the invention has been described in its presently preferred form, it is to be understood that there are numerous applications and implementations for the present invention. Accordingly, the invention is capable of modification and changes without departing from the spirit of the invention as set forth in the appended claims.

What is claimed is:

1. An amplifier network, comprising:
   a first amplifier receiving a network input signal and generating a first output signal;
   an equalizer receiving the first output signal and attenuating the first output signal in accordance with a frequency of the input signal, the equalizer generating an equalized signal; and
   a second amplifier receiving the equalized signal and generating a network output signal;
   wherein the equalizer further comprises a PI network and a TEE network interconnected in a symmetric configuration.

2. An amplifier network, comprising:
   a first amplifier receiving a network input signal and generating a first output signal;
   an equalizer receiving the first output signal and attenuating the first output signal in accordance with a frequency of the input signal, the equalizer generating an equalized signal; and
   a second amplifier receiving the equalized signal and generating a network output signal;
   wherein the equalizer further comprises
       a series leg interconnecting the first and second amplifiers in series; and
       a shunt leg interconnecting the first and second amplifiers in parallel.

3. An amplifier network, comprising:
   a first amplifier receiving a network input signal and generating a first output signal;
   an equalizer receiving the first output signal and attenuating the first output signal in accordance with a frequency of the input signal, the equalizer generating an equalized signal; and
   a second amplifier receiving the equalized signal and generating a network output signal;
   wherein the equalizer further comprises
       a series leg interconnecting the first and second amplifiers in series; and
       a shunt leg interconnecting the first and second amplifiers in parallel,
   wherein the frequency of the input signal varies a respective series current and a shunt current.

4. The apparatus of claim 3 wherein an increase in frequency of the input signal decreases the series impedance and increases the shunt impedance.

5. The apparatus of claim 4 wherein an increase in frequency decreases the attenuation applied by the equalizer.

6. The apparatus of claim 3 wherein a decrease in frequency of the input signal increases the series impedance and decreases the shunt impedance.

7. The apparatus of claim 6 wherein a decrease in frequency of the input signal increases the attenuation applied by the equalizer.

8. An amplifier network, comprising:
   a first amplifier receiving a network input signal and generating a first output signal;
   an equalizer receiving the first output signal and attenuating the first output signal in accordance with a frequency of the input signal, the equalizer generating an equalized signal; and
   a second amplifier receiving the equalized signal and generating a network output signal;
   wherein the equalizer further comprises:
       an input resistance at an input to the equalizer;
       an output resistance at an output of the equalizer;
       a series resistance in series with the input and output resistances;
       a capacitance in parallel with the series resistance;
       an inductance;
       a first shunt resistance connected at one terminal to each of the input resistance and series resistance, and at the other terminal to the inductance; and
       a second shunt resistance connected at one terminal to each of the output resistance and series resistance, and at the other terminal to the inductance.

9. An amplifier network, comprising:
   a first amplifier receiving a network Input signal and generating a first output signal;
   an equalizer including:
       an input resistance receiving the first output signal,
       an output resistance,
       a series resistance in series with the input and output resistances,
       a capacitance in parallel with the series resistance,
       an inductance,
       a first shunt resistance connected at one terminal to each of the input resistance and series resistance, and at the other terminal to the inductance, and
       a second shunt resistance connected at one terminal to each of the output resistance and series resistance, and at the other terminal to the inductance,
   wherein the equalizer recedes the first output signal and attenuates the first output signal in accordance with a frequency of the input signal, the equalizer generating an equalized signal; and
   a second amplifier receiving the equalized signal and generating a network output signal.

10. The apparatus of claim 9 wherein the equalizer further comprises:
    a series leg defined by the input resistance, the output resistance, the series resistance, and the capacitance; and
    a shunt leg defined by the first shunt resistance, the second shunt resistance, and the inductance.

11. The apparatus of claim 10 wherein the frequency of the input signal varies a respective series impedance and shunt impedance in the respective series and shunt legs.

12. The apparatus of claim 11 wherein an increase in frequency of the input signal decreases the series impedance and increases the shunt impedance.

13. The apparatus of claim 12 wherein an increase in frequency of the input signal decreases the attenuation applied by the equalizer.

14. The apparatus of claim 11 wherein a decrease in frequency of the input signal increases the series impedance and decreases the shunt impedance.

15. The apparatus of claim 14 wherein a decrease in frequency of the input signal increases the attenuation applied by the equalizer.

16. An amplifier network, comprising:
    means for amplifier a network input signal to generate a first output signal;

means for attenuating the first output signal in accordance with a frequency of the input signal to generate an equalized signal; and means for amplifying the equalized signal to generate a network output signal;

wherein the means for attenuating further comprises a PI network and a TEE network interconnected in a symmetric configuration.

* * * * *